United States Patent
Shaffner et al.

(10) Patent No.: US 6,463,556 B1
(45) Date of Patent: Oct. 8, 2002

(54) METHOD AND APPARATUS FOR INTERLEAVING IN A COMMUNICATION SYSTEM

(75) Inventors: Terry Michael Shaffner, Palatine, IL (US); Michael Mao Wang, Carpentersville, IL (US); Tyler Brown, Mundelein, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/473,750

(22) Filed: Dec. 28, 1999

Related U.S. Application Data

(60) Provisional application No. 60/114,654, filed on Jan. 4, 1999.

(51) Int. Cl.$^7$ .................................................. G06F 11/00
(52) U.S. Cl. ........................................................ 714/701
(58) Field of Search ........................ 714/762, 786–788, 714/701, 702

(56) References Cited

U.S. PATENT DOCUMENTS 4,974,188 A * 11/1990 Dolecek ...................... 708/700
6,304,991 B1 * 10/2001 Rowitch et al. ............. 714/755

* cited by examiner

*Primary Examiner*—Albert Decady
*Assistant Examiner*—Shelly A Chase
(74) *Attorney, Agent, or Firm*—Kenneth A. Haas; Jeffrey K. Jacobs

(57) ABSTRACT

Interleaving within a communication system occurs by finding a minimum value (m) such that that $N<=2^n \times (2^m-1)$, wherein N is an interleave block length, and n is a predetermined fixed value. A maximum-length sequence generator is initialized to 1 and a bit reverse sequence generator is initialized to 0. An n bit output is determined from the bit reverse sequence generator, and an m bit output is determined from the maximum length sequence generator. Finally, the n bit output is used as a most significant bit and the m bit output is used as a least significant bit for an interleaver address.

4 Claims, 1 Drawing Sheet

METHOD AND APPARATUS FOR INTERLEAVING IN A COMMUNICATION SYSTEM

RELATED APPLICATIONS

The present invention claims priority from provisional application Ser. No. 60/114,654 "Turbo Code Interleaver" filed on Jan. 4, 1999, and assigned to the assignee of the present invention.

FIELD OF THE INVENTION

The present invention relates generally to data transmission and, in particular, to interleaving during data transmission.

BACKGROUND OF THE INVENTION

Communication systems take many forms. In general, the purpose of a communication system to transmit information-bearing signals from a source, located at one point, to a user destination, located at another point some distance away. A communication system generally consists of three basic components: transmitter, channel, and receiver. The transmitter has the function of processing the message signal into a form suitable for transmission over the channel. This processing of the message signal is referred to as modulation. The function of the channel is to provide a physical connection between the transmitter output and the receiver input. The function of the receiver is to process the received signal so as to produce an estimate of the original message signal. This processing of the received signal is referred to as demodulation.

Analog and digital transmission methods are used to transmit a message signal over a communication channel. The use of digital methods offers several operational advantages over analog methods, including but not limited to: increased immunity to channel noise and interference, flexible operation of the system, common format for the transmission of different kinds of message signals, improved security of communication through the use of encryption and increased capacity.

With digital communication, user information such as speech is encoded into sequences of binary information symbols. This encoding is convenient for modulation and is easily error-correction coded for transmission over a potentially degrading communication channel. In order to deliver reliable information in a noisy environment, many techniques (e.g., convolutional encoding, interleaving at the symbol level, ..., etc.) are utilized to improve the quality of the demodulated signal. Although these techniques greatly improve the reliability of information transmitted, situations exist where current techniques are inadequate to provide reliable information in noisy environments. For example, prior-art techniques for interleaving include randomly generating an interleaving address table. This technique has a disadvantage that entire interleaving tables for different data lengths have to be stored in both transmitters and receivers. Consequently there exists a need for a method and apparatus for interleaving within a communication system that requires minimum storage for variable data length.

DETAILED DESCRIPTION OF THE PREFERRED EMBODIMENTS

Figure 1:
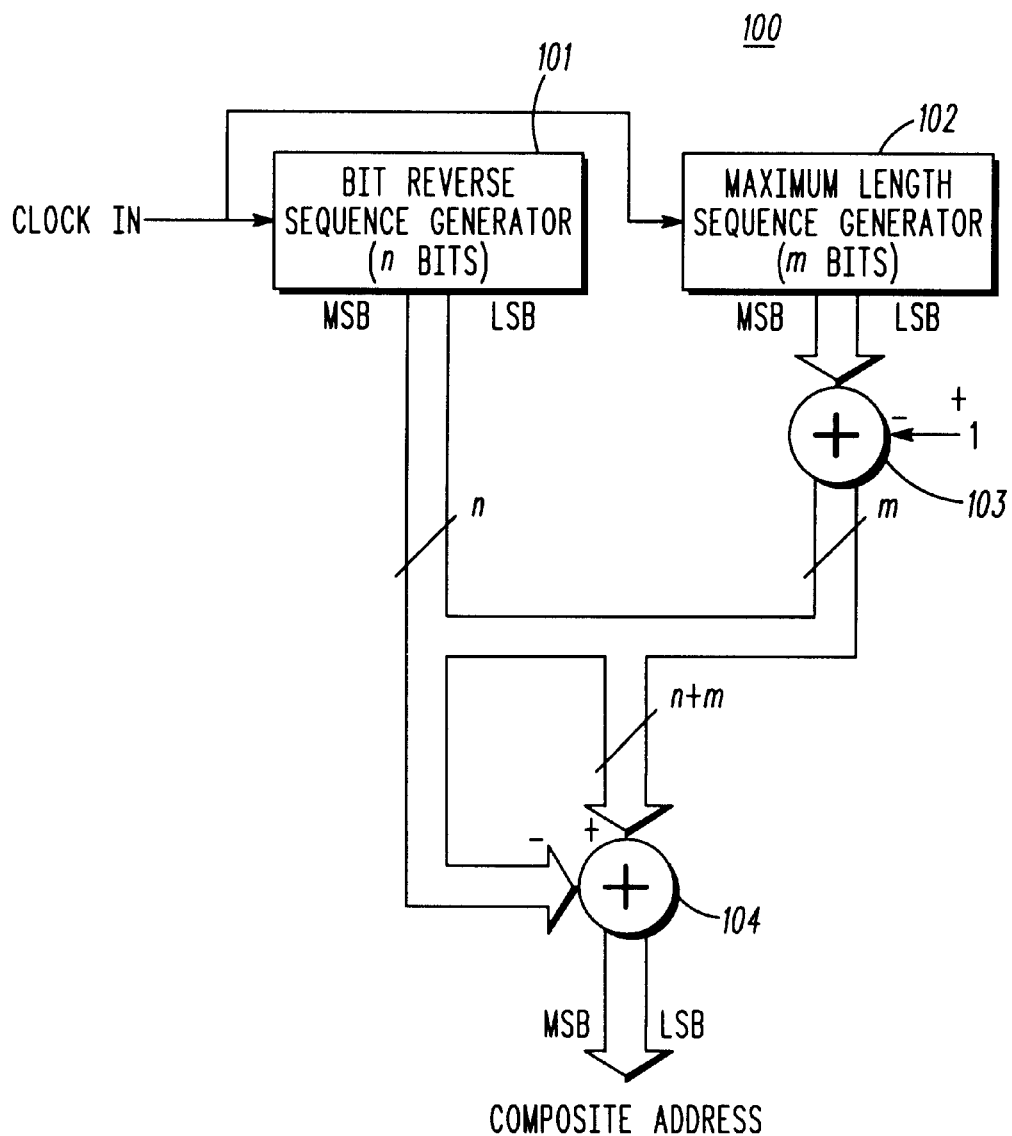
FIG. 1 is a block diagram of an interleaver in accordance with the preferred embodiment of the present invention.

To address the need for an interleaver that solves the above-mentioned need, a method and apparatus for interleaving is described herein. Interleaving within a communication system occurs by finding a minimum value (m) such that $N<=2^n \times (2^m-1)$, wherein N is an interleave block length, and n is a predetermined fixed value. A maximum-length sequence generator is initialized to 1 and a bit reverse sequence generator is initialized to 0. An n bit output is determined from the bit reverse sequence generator, and an m bit output is determined from the maximum length sequence generator. Finally, the n bit output is used as a most significant bit and the m bit output is used as a least significant bit for an interleaver address. The proposed interleaver has comparable performance to the best known interleavers without requiring large look-up tables. Additionally, addresses are easily generated on the fly with a small and deterministic latency.

The present invention encompasses a method for interleaving within a communication system. The method comprises the steps of finding a minimum value (m) such that $N<=2^n \times (2^m-1)$, wherein N is an interleave block length, and n is a predetermined fixed value. A maximum-length sequence generator is initialized to 1 and a bit reverse sequence generator is initialized to 0. An n bit output is determined from the bit reverse sequence generator, and an m bit output is determined from the maximum length sequence generator. Finally, the n bit output is used as a most significant bit and the m bit output is used as a least significant bit for an interleaver address.

The present invention additionally encompasses an apparatus for interleaving within a communication system. The apparatus comprises a bit reverse sequence generator having a clocking signal as an input, and outputting most significant bits of an interleaver address. The apparatus additionally comprises a maximum length sequence generator having the clocking signal as an input, and outputting least significant bits of an interleaver address.

Turning now to the drawings, where like numerals designate like components, FIG. 1 is a block diagram of interleaver 100 in accordance with the preferred embodiment of the present invention. Interleaver 100 comprises bit reverse sequence generator 101, maximum length sequence generator 102, and summers 103–104. For a given information block length N, the turbo interleaver first needs to find the minimum m and n such that $N<=2^n \times (2^m-1)$. For simplicity, n can also be a predetermined fixed value, for example, 5. Assuming $N<=2^n \times (2^m-1)$, since $2^n$ and $2^m-1$ are relatively prime, there exists N! one-to-one mappings between $\{x(i):x(i)=i, i=0, 1, \ldots, N-1\}$ and $\{y(p,q)=p\times(2^m-1)+q: p=0, 1, \ldots, 2^n-1; q=0, 1, \ldots, 2^m-2\}$. If a mapping is chosen such that $$x(i) \Leftrightarrow y(i)=p(i)\times(2^m-1)+q$$

where $$q(i)=pn_m(i)-1$$

$$p(i)=br_n(i)$$

then for $i=0, 1, \ldots, N-1$, where $pn_m$ is the m-bit maximum length sequence generator with period of $2^m-1$ (Note: no zero insertion is needed) and $br_n$ is the n-bit bit reverse sequence generator with period of $2^n$. In other words $$br_n(i) = \sum_{i=0}^{n-1} b_{n-j-1} 2^j$$

where $b_j$ is defined as $$\sum_{i=0}^{n-1} b_j 2 = mod_{2^n}(i).$$

For $N<2^n \times (2^m-1)$, puncturing is needed.

Examples of the maximum length sequence generator polynomials (MLSGP) for different m's are listed in Table 1.

TABLE 1

| m | 3 | 4 | 5 | 6 | 7 | 8 | 9 | 10 | 11 |
|---|---|---|---|---|---|---|---|---|---|
| MLSGP(hex) | 6 | 9 | 1e | 2d | 44 | fa | 152 | 279 | 6c9 |

The following summarizes the operation of the proposed interleaver:

1. Find the minimum m for required block length and the corresponding >generator polynomial as listed in Table 1.
2. Initialize maximum length sequence generator to 1 and the bit reverse sequence generator to 0.
3. The n bit output from bit reverse sequence generator is used as the MSBs and the m bit output from the maximum length sequence generator is used as the LSBs of the composite interleaver address. If the composite address is not a legal address, discard it.
4. Clock both generators once.
5. Loop back to step 3 until all information bits are interleaved.

The descriptions of the invention, the specific details, and the drawings mentioned above, are not meant to limit the scope of the present invention. It is the intent of the inventors that various modifications can be made to the present invention without varying from the spirit and scope of the invention, and it is intended that all such modifications come within the scope of the following claims and their equivalents.

What is claimed is:

1. A method for interleaving data, the method comprising the steps of:
   (a) finding a minimum value (m) such that $N<=2^n \times (2^m-1)$, wherein N is an interleave block length, and n is a predetermined fixed value;
   (b) initialize a maximum-length sequence generator to 1 and a bit reverse sequence generator to 0;
   (c) determining an n bit output from the bit reverse sequence generator;
   (d) determining an m bit output from the maximum length sequence generator; and
   (e) using the n bit output as a most significant bit and the m bit output as a least significant bit for an interleaver address.

2. The method of claim 1 further comprising the step of:
   clocking the maximum-length sequence generator and the bit reverse sequence generator; and
   performing steps (c) through (e) until a plurality of information bits are interleaved.

3. The method of claim 1 further comprising the steps of:
   determining if the interleaver address is a valid address; and
   clocking the maximum-length sequence generator and be bit reverse sequence generator based on the determination.

4. An apparatus for interleaving comprising:
   a bit reverse sequence generator having a clocking signal as an input, and outputting most significant bits of an interleaver address; and
   a maximum length sequence generator having the clocking signal as an input, and outputting least significant bits of an interleaver address.

* * * * *

UNITED STATES PATENT AND TRADEMARK OFFICE
CERTIFICATE OF CORRECTION

PATENT NO. : 6,463,556 B1
DATED : October 8, 2002
INVENTOR(S) : Schaffner et al.

It is certified that error appears in the above-identified patent and that said Letters Patent is hereby corrected as shown below:

Column 4,
Line 28, reads "and be", should be -- and the --.

Signed and Sealed this

Twenty-fifth Day of March, 2003

JAMES E. ROGAN
*Director of the United States Patent and Trademark Office*